US005563331A

United States Patent [19]
Von Helmolt et al.

[11] Patent Number: 5,563,331
[45] Date of Patent: Oct. 8, 1996

[54] MAGNETORESISTIVE SENSOR UTILIZING A SENSOR MATERIAL WITH A PEROVSKITE-LIKE CRYSTAL STRUCTURE

[75] Inventors: Rittmar Von Helmolt, Erlangen; Joachim Wecker, Roettenbach, both of Germany

[73] Assignee: Siemens Aktiengesellschaft, Munich, Germany

[21] Appl. No.: 312,020

[22] Filed: Sep. 26, 1994

[30] Foreign Application Priority Data

Sep. 29, 1993 [DE] Germany ............... 43 33 180.7

[51] Int. Cl.⁶ .................... G01N 7/00; G01N 9/00
[52] U.S. Cl. .................. 73/31.05; 73/23.31; 73/721;
73/727; 73/862.627; 428/697; 428/701;
428/702; 428/212; 338/32 R; 360/113;
324/252
[58] Field of Search ............... 73/23.31, 23.32,
73/31.05, 31.06, 727, 721, 862.627; 338/34,
308, 32 R; 324/252; 428/697, 701, 702,
212; 360/113

[56] References Cited

U.S. PATENT DOCUMENTS

| | | | |
|---|---|---|---|
| 3,951,603 | 4/1976 | Obayashi et al. | 73/31.05 |
| 4,507,643 | 3/1985 | Sunano et al. | 73/31.06 |
| 4,601,883 | 7/1986 | Sekido et al. | 73/31.05 |
| 4,793,872 | 12/1988 | Meunier et al. | 148/33.4 |
| 4,827,218 | 5/1989 | Meunier et al. | 324/252 |
| 5,068,050 | 11/1991 | Inomata et al. | 252/62.51 |
| 5,225,286 | 7/1993 | Fujikawa et al. | 428/697 |
| 5,297,438 | 3/1994 | Alles et al. | 73/727 |
| 5,302,461 | 4/1994 | Anthony | 428/472 |
| 5,314,547 | 5/1994 | Heremans et al. | 148/33.1 |
| 5,341,118 | 8/1994 | Parkin et al. | 338/32 R |
| 5,397,541 | 3/1995 | Post | 73/23.31 |
| 5,411,814 | 5/1995 | Jin et al. | 428/692 |
| 5,422,571 | 6/1995 | Gurney et al. | 324/252 |
| 5,432,734 | 7/1995 | Kawano et al. | 365/158 |
| 5,436,778 | 7/1995 | Lin et al. | 360/113 |
| 5,452,163 | 9/1995 | Coffey et al. | 360/113 |

FOREIGN PATENT DOCUMENTS 38 16 192  10/1992  Germany .

OTHER PUBLICATIONS

Physica B, vol. 155, 1989, pp. 362–365, North Holland, Amsterdam, R. M. Kusters et al.: *Magnetoresistance Measurements on the Magnetic Semiconductor $Nd_{0.5}Pb_{0.5}MnO_3$*.
Appl. Phys. Lett., vol. 53, No. 16, 17 Oct. 1988, pp. 1557–1559; B. Roas et al.: *Epitaxial growth of $YBa_2Cu_3O_{7-x}$ thin films by a laser evaporation process.*
Appl. Phys. Lett., vol. 58, No. 23, 10 Jun. 1991, pp. 2710–2712; S. S. P. Parkin et al.: *Giant magnetoresistance in antiferromagnetic Co/Cu multilayers.*
Appl. Phys. Lett., vol. 61, No. 26, 28 Dec. 1992, pp. 3177–3180; B. Holzapfel et al.: *Off-axis laser deposition of $YBa_2Cu_3O_{7-\delta}$ thin films.*
Sensors, vol. 5, 1989, pp. 341–380.
Phys. Rev. Lett., vol. 64, No. 19, 7 May 1990, pp. 2304–2307; S. S. P. Parkin et al.: *Oscillations in Exchange Coupling and Magnetoresistance in Metallic Superlattice Structures: Co/Ru, Co/Cr, and Fe/Cr.*

(List continued on next page.)

*Primary Examiner*—Hezron E. Williams
*Assistant Examiner*—Richard A. Moller
*Attorney, Agent, or Firm*—Kenyon & Kenyon

[57] ABSTRACT

A magnetoresistive sensor may be constructed with material having a perovskite-like crystal structure and an increased magnetoresistive effect. The material is based on the composition $(A1)_{1-x}(A2)_x MnO_z$, with A1 (trivalent) selected from Y, La, or a lanthanide, A2 (bivalent) from an alkaline-earth metal or Pb, and with $0.1 \leq x \leq 0.9$ and $2.0 \leq z \leq 3.5$. The sensor contains a layer system with at least two layers with different materials, but in each case in the context of the aforesaid composition, which is selected so that the temperature correlation of the electrical resistance is relatively small. The two layers of the layer system can also be united into a single layer structure with a concentration gradient.

13 Claims, 3 Drawing Sheets

OTHER PUBLICATIONS

Phys. Rev. Lett., vol. 61, No. 21, 21 Nov. 1988, pp. 2472–2475; P. Eitenne et al.: *Giant Magnetoresistance of (001) Fe/(001) Cr Magnetic Superlattices.*

Phys. Rev. Lett., vol. 68, No. 25, 22 Jun. 1992, pp. 3745–3752; A. E. Berkowitz: *Giant Magnetoresistance in Heterogeneous Cu—Co Alloys.*

J. Appl. Phys., vol. 38, No. 3, 1 Mar. 1967, pp. 959–964; S. von Molnar et al.: *Giant Negative Magnetoresistance in Ferromagnetic $Eu_{1-x}Gd_xSe$.*

Solid State Commun., vol. 82, No. 9, pp. 693–696, 1992; R. von Helmolt et al.: *Metal–Semiconductor–Transition and Spin–Glass Properties of . . . .*

MAGNETORESISTIVE SENSOR UTILIZING A SENSOR MATERIAL WITH A PEROVSKITE-LIKE CRYSTAL STRUCTURE

BACKGROUND OF THE INVENTION

The present invention relates to a magnetoresistive sensor with a layer made of a sensor material that possesses a perovskite-like crystal structure and exhibits an increased magnetoresistive effect.

The general structure and operation of magnetoresistive sensors with thin films made of ferromagnetic transition metals are explained further in, for example, the book "Sensors", Vol. 5, 1989, pp. 341–380. The layers of the sensors disclosed in that reference are largely free of magnetostriction and consist, for example, of a special NiFe alloy (Permalloy) or a special NiCo alloy, and however exhibit only a relatively small magnetoresistive effect $M_r$ of approximately 2 to 3%. In this context, $M_r=[R(0)-R(B)]/R(0)$, where $R(B)$ is the electrical resistance in a magnetic field with induction B, and $R(0)$ is the resistance in the absence of a magnetic field. The magnetoresistive effect is also sometimes defined as follows:

$$M_r'=[R(0)-R(B)]/R(B); \text{ i.e. } M_r=M_r'/(1+M_r)$$

There is interest in increasing this magnetoresistive effect in order to produce sensors with an improved signal-to-noise ratio and expand the range of applications for such sensors. An increase in magnetoresistive effect has been detected in several multilayer systems such as Co/Cu, Co/Ru, Co/Cr, and Fe/Cr (cf. for example "Applied Physics Letters", Vol. 58, No. 23, Jun. 10, 1991, pp. 2710–2712; or "Physical Review Letters", Vol. 64, No. 19, May 7, 1990, pp. 2304–2307). These are based on the fact that a nonmagnetic intermediate layer between layers of ferromagnetic material can cause exchange coupling (exchange interaction). This coupling depends on the thickness of the intermediate layer, and requires thicknesses in the nanometer range. Exchange coupling is responsible for the magnetic characteristics ("ferromagnetic" or "antiferromagnetic") of the multilayer system.

Multilayer systems with different polarization directions for the superimposed individual ferromagnetic layers that are separated by nonmagnetic layers can accordingly exhibit an increased magnetoresistive effect $M_r$. This effect, which can be up to 40% for sandwiched Cu-Co thin-film structures at room temperature (cf. the earlier citation from "Applied Physics Letters", Vol. 58), is therefore referred to as the "giant magnetoresistive" (GMR) effect (cf. "Physical Review Letters", Vol. 61, No. 21, Nov. 21, 1988, pp. 2472–2475).

However, the limitation to multilayer systems and strong dependence of the effect on the very low thickness (nanometer range) of the magnetic and nonmagnetic layers, makes heavy demands on the layer preparation technique and restricts the range of application to corresponding thin-film structures.

Investigations which indicate that a magnetoresistive effect can also occur, for example, in granular material systems (cf. "Physical Review Letters", Vol. 68, No. 25, 1992, pp. 3745–3752) are also known. According to these investigations, which concern the Cu-Co material system, CuCo alloy layers are produced by simultaneous sputtering of the elements, and nanocrystalline (magnetic) Co precipitates in a (nonmagnetic) Cu matrix are produced by subsequent heat treatment. According to the aforesaid citation from "Physical Review Letters", Vol. 68, the magnetoresistive effect that can be measured in these thin films is approximately 7% at room temperature.

Substantially greater magnetoresistive effects have also been observed in other ferromagnetic material systems. This applies to single crystals of the material system $Eu_{1-x}Gd_xSe$ (cf. "Journal of Applied Physics," Vol. 38, No. 3, Mar. 1, 1967, pp. 959–964). A corresponding effect is also evident in $Nd_{0.5}Pb_{0.5}MnO_3$ crystals; these crystals have a perovskite-like structure (cf. "Physics B," Vol. 155, 1989, pp. 362–365). However, the change in electrical resistance as a function of magnetic induction observed in these material systems is confined to low temperatures that are well below room temperature.

SUMMARY OF THE INVENTION

The problems with the devices mentioned above do not occur, or at least occur only to a reduced extent, in a sensor material that is the subject of a German patent application No. P 43 10 318.9 (not previously disclosed). This material possesses a perovskite-like crystal structure and exhibits an increased magnetoresistive effect. A composition based on $(A1)_{1-x}(A2)_xMnO_z$ is to be selected for the material, such that the trivalent constituent A1 at least contains a lanthanide including lanthanum (La) or yttrium (Y), and the bivalent constituent A2 at least contains an alkaline-earth metal or lead (Pb), and $0.1 \leq x \leq 0.9$ and $2.0 \leq z \leq 3.5$.

The fundamental composition with the four aforesaid constituents is to be understood on the basis of the composition cited here. The individual constituents represent major constituents that may, as applicable, be substituted by other elements in a smaller proportion (less than 50%), specifically by another element from the element group cited with reference to the respective constituent. In particular, for example, up to 35 atomic percent of the Mn constituent can be replaced by another metal with a 3d electron configuration, preferably also by Cu or Al. The composition of this constituent is then: $Mn_{1-y}(A3)_y$, where $0<y<0.35$. The 3d elements are those elements in the periodic system of the elements with atomic numbers between 21 and 30 (inclusive). Of course the usual impurity elements can also be present in the proposed material, each at a proportion of less than 0.5 atomic percent. It was found that the proposed material exhibits a relatively high magnetoresistive effect, so that it is advantageously provided for magnetoresistive sensors. Depending on the stoichiometry of the composition, the Curie temperature of the sensor material lies approximately at room temperature. At this temperature the material also exhibits the aforementioned electronic transition from the localized (semiconducting) nonmagnetic state to the metallically conducting magnetic state (cf. "Solid State Communications," Vol. 82, No. 9, 1992, pp. 693–696). The formal Mn valence, which influences conductivity and transition temperature, is determined by the proportions of the trivalent A1 constituent and the bivalent A2 constituent. For example, assuming valences $O=-2$, $La=+3$, and $Ba=+2$, a formal Mn valence of 3.33 is obtained for the composition $La_{2/3}Ba_{1/3}MnO_3$. A proportion x of between 10 and 90 atomic percent with reference to the A1+A2 proportion (=100 atomic percent) is advantageous for the envisioned application in magnetoresistive sensors. The substitution of Mn by other 3d or 4s elements has a similar influence; up to 35 atomic percent of the Mn constituent can be replaced by the other element. An oxygen content such that $z \approx 3$ may also be considered particularly favorable.

In a particularly favorable manner, the sensor material can be deposited as a layer onto a substrate by laser ablation of a corresponding target material. This deposition can, for example, occur off-axis.

It is recognized, however, that the high magnetoresistive effect $M_r$ of the proposed material is accompanied by a relatively large temperature correlation that derives from the physical cause of the magnetoresistance, which in this case is linked to the ferromagnetic transition.

The present invention relates to a magnetoresistive sensor of the aforesaid kind with the proposed sensor material in such a way that this temperature correlation of the magnetoresistive effect is diminished.

According to the present invention, a layer system is provided, with a first layer and a second layer. The second layer is made of a second material that also has a composition on the aforesaid basis but differs from the material of the first layer, in terms of the proportion and/or the element of at least one of its constituents, in such a way that the temperature correlation of the electrical resistance of the layer system is reduced with respect to that of the electrical resistance of each individual layer.

According to the present invention, the temperature correlation of the electrical resistance and thus also of the magnetoresistance is thus reduced by the fact that different materials with different transition temperatures are combined into a layer system. In the simplest case, this combination can be achieved by superimposed layering of two ceramic layers with somewhat different compositions.

A magnetoresistive sensor according to an embodiment of the present invention includes at least two layers, a first layer and a second layer. Each of the first and second layers is made of a sensor material that possesses a perovskite-like crystal structure and exhibits an increased magnetoresistive effect. The sensor material of each of the first and second layers has a composition based on $(A1)_{1-x}(A2)_xMnO_z$, where A1 is a trivalent constituent which is selected from a group of the lanthanides including lanthanum (La), or from yttrium (Y), and where A2 is a bivalent constituent selected from a group of alkaline-earth metals, or from lead (Pb), where: $0.1 \leq x \leq 0.9$ and $2.0 \leq z \leq 3.5$. The sensor material of the second layer of the layer system differs, in terms of proportion and/or element of at least one of its constituents A1, A2, Mn, and O, from the sensor material of the first layer of the layer system in such a way that a temperature correlation of the electrical resistance of the layer system is reduced with respect to that of the electrical resistance of each individual layer.

In a further embodiment of the present invention, the sensor material of the first layer and the sensor material of the second layer have the same constituents A1 and A2.

According to another embodiment of the present invention, in at least one of the first and second layers, the Mn of the Mn constituent is partly replaced by at least one additional element A3 from a group of subgroup elements with a 3d electron configuration, or by copper (Cu), or by aluminum (Al), so that the constituent has the composition: $Mn_{1-y}(A3)_y$, where $0 < y \leq 0.35$.

In an embodiment of the present invention in which the layer system includes more than two layers, adjacent layers alternate between the first and second layers.

BRIEF DESCRIPTION OF THE DRAWINGS

Advantageous embodiments and further advantages of the magnetoresistive sensor according to the present invention are described as follows, in conjunction with the attached drawings.

DETAILED DESCRIPTION

Figure 1:
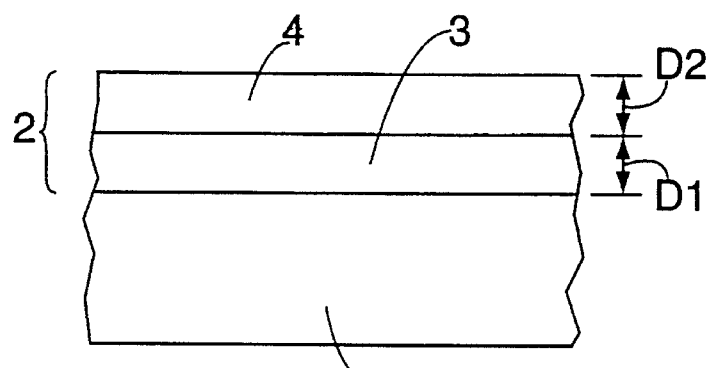
FIG. 1 schematically illustrates a magnetoresistive sensor according to an embodiment of the present invention.

The sensor according to an embodiment of the invention is intended to have a layer system with multiple layers, at least some of which are made of sensor materials with different compositions. The sensor can, for example, contain a layer system with more than two layers, such that alternating layers with different compositions lie one above the other. According to the cross section shown in FIG. 1, a system consisting of two sensor layers 3 and 4 on a substrate 5 is taken as the simplest embodiment of a layer system 2. The thicknesses D1 and D2 of layers 3 and 4 can be the same or also, if applicable, different, and are generally between 10 nm and 10 μm. Different compositions based on the common system $(A1)_{1-x}(A2)_xMnO_z$ are intended to be selected for the sensor materials of these layers 3 and 4. In this context the A1 constituent is Y or a lanthanide such as La, Pr, Nd, Sin, Eu, or Dy. The A2 constituent is intended to be selected from the group of alkaline-earth metals, in particular Mg, Ca, Sr, Ba, or from Pb. The individual proportions of the constituents are to be selected so that:

$0.1 \leq x \leq 0.9$, and preferably $0.25 \leq x \leq 0.75$, and $2.0 \leq z \leq 3.5$, and preferably $z \approx 3$.

The two constituents A1 and A2 are each intended to have one element from the respective element group. In addition, up to 35 atomic percent of the Mn constituent of each layer can also be replaced by another of the group of metals mentioned above. Moreover, the composition indicated can also contain minimal impurities with less than 0.5 atomic percent of each impurity element. Exemplary embodiments for corresponding materials are therefore $La_{0.67}Ba_{0.33}MnO_3$, or $Pr_{0.5}Sr_{0.5}MnO_3$, or $Nd_{0.33}Ca_{0.67}MnO_3$, or $(Dy_{0.67}Mg_{0.33})(Mn_{0.8}Cu_{0.2})O_{2.9}$. All these materials have a perovskite-like crystal structure and are characterized by an increased magnetoresistive effect $M_r$ of, in particular, more than 10%, and preferably more than 50%. The effect is thus considerably greater than in known Cu/Co multilayer systems.

Layers of the material according to the present invention can be manufactured, for example, using sputter processes or special vacuum evaporation processes. Also, manufacture of a layer by means of laser evaporation is particularly suitable, as is known for the manufacture of metal-oxide superconductor materials with transition temperatures $T_c$ in particular above 77 K (cf. for example "Applied Physics Letters", Vol. 53, No. 16, Oct. 17, 1988, pp. 1557–1559). According to the present invention, corresponding layers of the sensor material are advantageously deposited onto substrates whose respective crystalline unit cell has dimensions matched to the unit cell of the sensor material. Substrate materials that also have a perovskite-like crystal structure are therefore particularly suitable. Corresponding exemplary embodiments are $SrTiO_3$, MgO, $LaAlO_3$, $NdGaO_3$, $MgAl_2O_4$, or Y-stabilized $ZrO_2$ (abbreviated YSZ). In addition, however, Si substrates that are coated with a special intermediate layer, called a "buffer layer," are also suitable. Such ^[intermediate layers are also known in the deposition of high-$T_c$ superconductor materials. One example is YSZ.

The deposition of the two layers 3 and 4, based on the material system La-Sr-Mn-O, onto a $SrTiO_3$ substrate 5 may be taken as a concrete exemplary embodiment of a two-layer system 2 illustrated in section in FIG. 1. Layer 3 is to have a composition $La_{0.7}Sr_{0.3}MnO_3$, and layer 4 a composition $La_{0.6}Sr_{0.4}MnO_3$. The deposition method provided is preferably laser evaporation (laser ablation) from a respective corresponding target material (cf. the previous citation from "Applied Physics Letters", Vol. 53, or German Patent No. 38 16 192). If applicable, the $SrTiO_3$ substrate 5 can be arranged with respect to the particle stream from the respective laser-ablated target material such that the normal line onto the surface or flat side being coated is aligned at least approximately perpendicular with reference to the propagation direction of the particle stream (called "off-axis deposition"; cf. for example "Applied Physics Letters", Vol. 61, No. 26, Dec. 28, 1992, pp. 3177–3180). For deposition, a partial pressure of an arbitrary gas of between $10^{-3}$ mbar and 100 mbar must be created in a suitable coating chamber. Advantageously, oxygen with a relatively high partial pressure between 0.2 mbar and 0.6 mbar is provided for deposition of the respective layer material. This is necessary in particular when an oxygen-free target material is used. In addition, it is advantageous if a temperature between 400° C. and 1,000° C. is maintained on substrate 5. If applicable, however, such heating of the substrate can also be dispensed with. Cooling during the coating process, to a temperature below 20 K, is in fact also possible.

Figure 2:
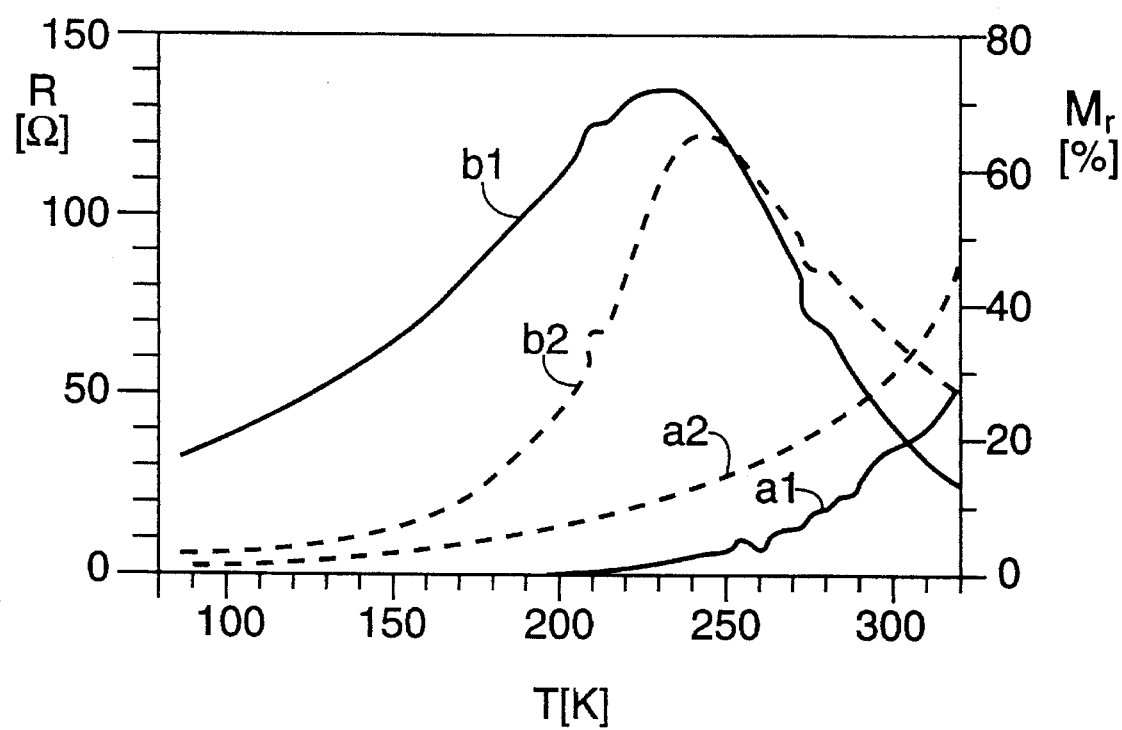
FIG. 2 illustrates, in a diagram, the temperature correlation of the electrical resistance and magnetoresistive effect of two different materials for such a sensor.

For comparison purposes, a 300-nm thick layer of $La_{0.7}Sr_{0.3}MnO_3$ and $La_{0.6}Sr_{0.4}MnO_3$ were first applied onto separate $SrTiO_3$ substrates. The diagram in FIG. 2 shows the temperature correlation of electrical resistance and magnetoresistive effect for these two layers. In the diagram, temperature T (in Kelvin) is plotted on the abscissa. Electrical resistance R (in Ω) is plotted on the left ordinate, and magnetoresistive effect Mr (in %) on the right ordinate, based on $M_r=[R(0)-R(5T)]/R(0)$. Solid curves a1 and b1 show the magnetoresistive effect $M_r$, while dashed curves a2 and b2 reproduce the electrical resistance R. Curves a1 and a2 refer to the material $La_{0.7}Sr_{0.3}MnO_3$, while material $La_{0.6}Sr_{0.4}MnO_3$ is the basis for curves b1 and b2. Comparing the shapes of curves a1 and a2 to those of curves b1 and b2, it is clearly evident that very different temperature correlations are produced for materials with different compositions.

According to the present invention, therefore, at least two layers 3 and 4 are combined into a layer system 2 (in FIG. 1). Within a temperature range of interest, these exhibit different temperature correlations for their electrical resistance and therefore their magnetoresistive effect. The compositions of the individual layers are intended to be selected so that practically opposite curves in the selected temperature range, as is evident from FIG. 2, compensate at least partly for one another in the structure of the layer system. In this manner, the temperature correlation of the electrical resistance and magnetoresistive effect can be reduced.

Figure 3:
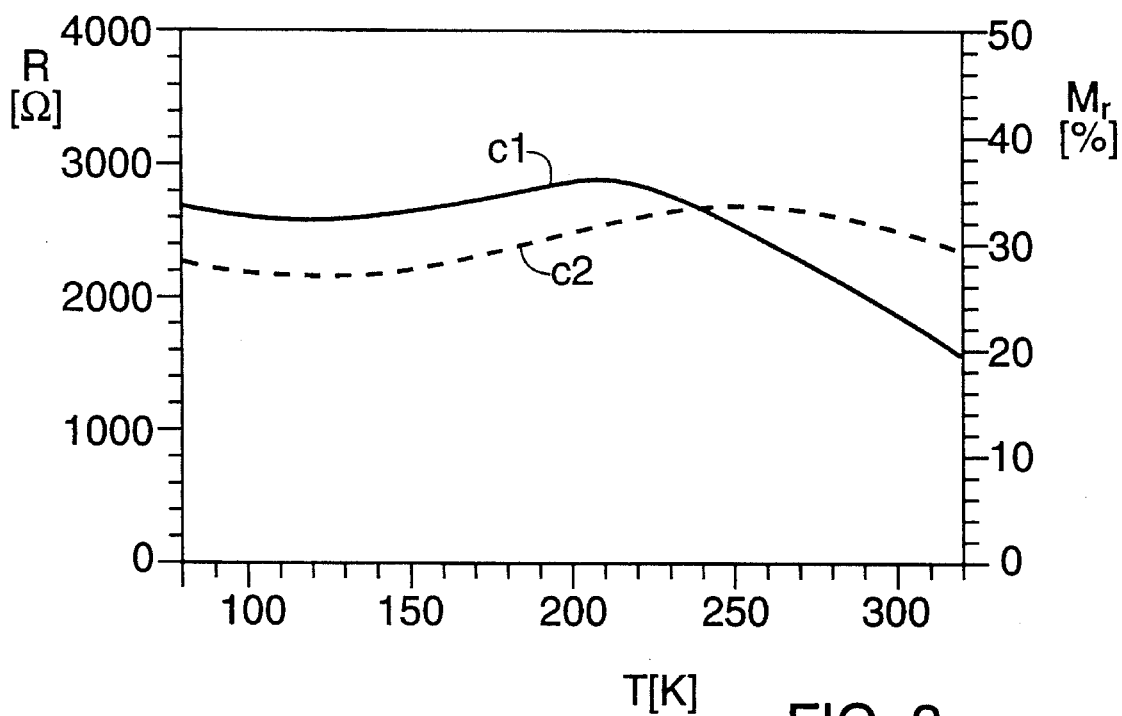
FIG. 3 depicts the temperature correlation of electrical resistance and magnetoresistive effect for a sensor according to the present invention.

This state of affairs can be deduced from the diagram in FIG. 3, for which a presentation corresponding to that of the diagram in FIG. 2 was selected. Curves c1 and c2 were obtained for a layer system 2 consisting of a 150-nm thick $La_{0.7}Sr_{0.3}MnO_3$ layer 3 and a 150-nm thick $La_{0.6}Sr_{0.4}MnO_3$ layer 4, on a $SrTiO_3$ substrate 5. Solid curve c1 shows the correlation of the magnetoresistive effect $M_r$, and dashed curve c2 the correlation of the electrical resistance R. Comparing the diagrams in FIGS. 2 and 3, it is immediately evident that the temperature correlation of the magnetoresistive effect in a sensor according to the present invention with a layer system can be considerably reduced as compared to sensors with individual layers.

In the exemplary embodiment on which the diagrams are based, it was assumed that the layers of the layer system have the same constituents but a different composition. Advantageously, a corresponding layer system is particularly easy to manufacture. The sensor according to the present invention is not, however, limited to a layer system of this kind. For example, different material systems can also be taken, if applicable, as the basis for adjacent layers of a layer system. One example would be a first layer of $La_{0.7}Sr_{0.3}MnO_3$ and a second layer of $La_{0.6}Ba_{0.4}MnO_3$, or a first layer of $Pr_{0.5}Sr_{0.5}MnO_3$ and a second layer of $Nd_{0.3}Ca_{0.7}MnO_3$. Of course a sensor according to the present invention can also be constructed from more than two layers.

A layer system with layers made of material systems of the type $(A1)_{1-x}(A2)_xMnO_z$, the constituents A1 and A2 of which each contain an element from the groups mentioned with reference thereto, was taken as the basis for the exemplary embodiment of a sensor according to the present invention described above. It is equally possible, however, to substitute other elements from the respective group for the elements selected for these constituents. Corresponding exemplary embodiments are $(La,Ce)_{0.67}Ba_{0.33}MnO_3$ or $Y_{0.67}(Ba,Sr)_{0.33}MnO_3$.

In addition, the Mn constituent can also advantageously be partially substituted by another element from the group of 3d elements (elements with an atomic number between 21 and 30 in the periodic system), or by Cu. This substitution should occur to a maximum of 35 atomic percent. Of course, in this case as well, the aforementioned substitutions for the A1 and A2 constituents are additionally possible.

Figure 4:
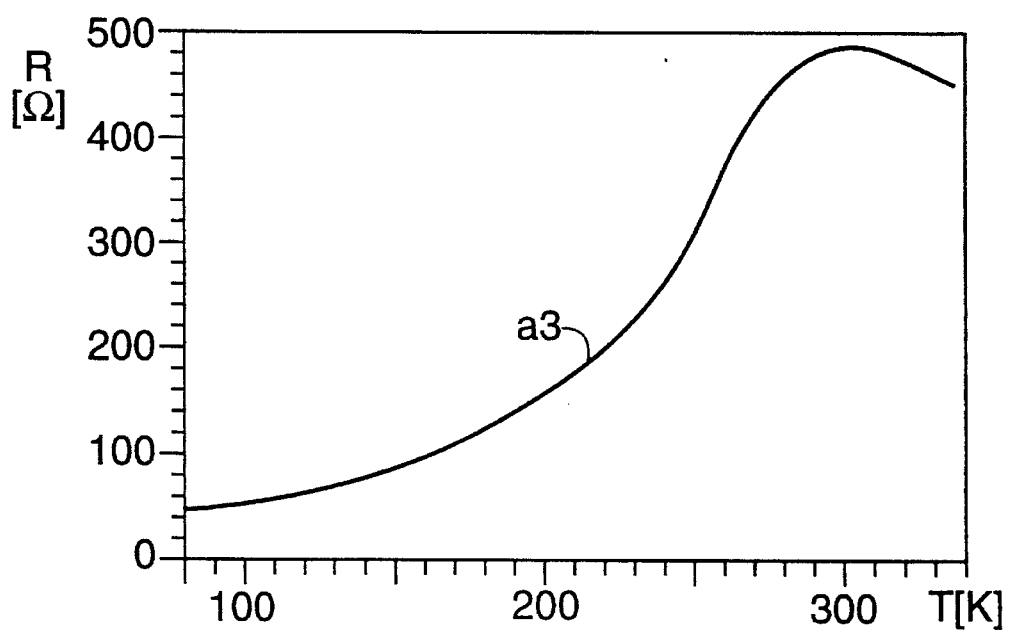
FIGS. 4, 5 and 6 illustrate, in each case in a diagram, the temperature correlation of electrical resistance and specific resistance for further materials suitable for the sensor according to the present invention.

The influence of a partial substitution of Mn by Co is evident from a comparison between curve a2 in the diagram of FIG. 2 and curve a3 in the diagram of FIG. 4. A presentation corresponding to FIG. 2 was selected for FIG. 4. Curve a3 was obtained for a material with composition $La_{0.7}Sr_{0.3}Mn_{0.9}Co_{0.1}O_{3+\delta}$ in the field-free state. A comparison of curves a2 and a3 confirms the possibility of constructing a layer system with reduced temperature correlation with a layer whose Mn constituent has been partially substituted, together with a layer without Mn substitution or with different Mn substitution.

Figure 5:
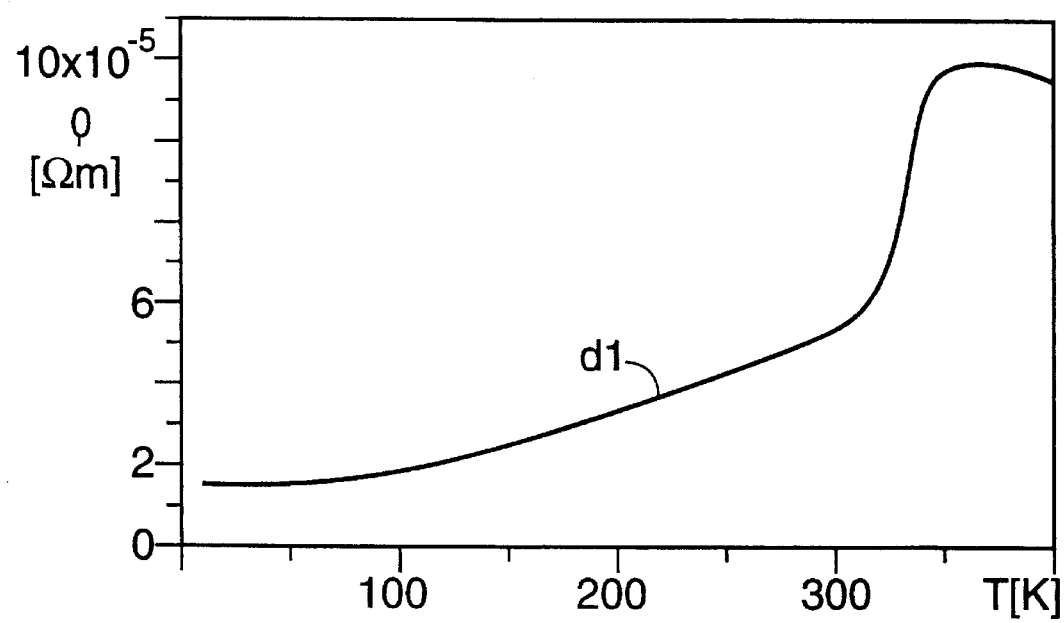
Figure 6:
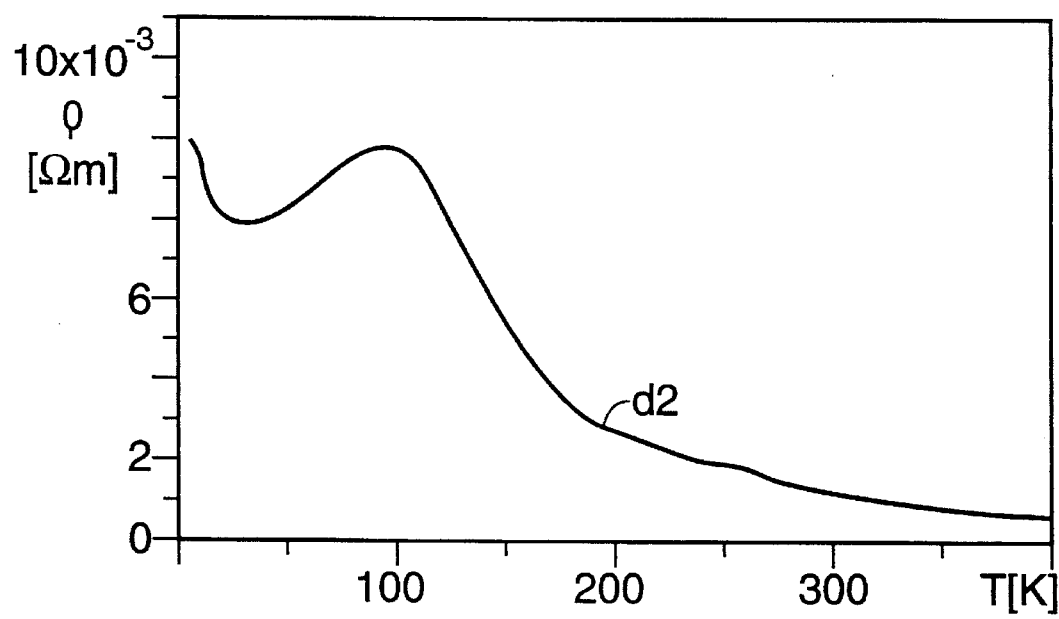

The same also applies to other Mn substitutions in the context of the aforesaid basic composition. A further exemplary embodiment of this kind is evident from the diagrams of FIGS. 5 and 6. A presentation largely corresponding to that of FIG. 4 was selected for these Figures, although specific resistance ρ (in $\delta*m$) is plotted in the ordinate axis. The basis for curve d1 shown in FIG. 5 was the material $La_{0.67}Ba_{0.33}MnO_{3+\delta}$, while curve d2 from FIG. 6 was obtained for the material $(La_{0.67}Ba_{0.37})(Mn_{0.9}Cu_{0.1})O_{3+\delta}$. A comparison of the two curves confirms the different temperature correlations of the materials, so that a sensor according to the present invention, with a layer system with different temperature correlations, can also be produced therewith.

In order to reduce the temperature correlation, it is possible not only to provide different compositions for the layers of a layer systems, but also, if applicable, additionally to select different layer thicknesses D1 and D2 for adjacent layers.

In the exemplary embodiments explained above, it was assumed that the layer system of the sensor according to the present invention contains at least two discrete layers. In the case of identical constituents of the materials for the at least two layers, however, it is also possible, instead of discrete layers, to manufacture a single layer structure, in a manner known in the art, in such a way that with regard to at least one of the material constituents selected for the layer structure, a continuous transition occurs from a first concentration to a second concentration. In this case the layer system of the sensor according to the present invention consists of a layer structure with a concentration gradient in terms of the said at least one constituent.

What is claimed is:

1. A magnetoresistive sensor having a layer system comprising at least two layers, including:

a first layer; and a second layer;

wherein each of said first and second layers comprises a sensor material that possesses a perovskite-like crystal structure and exhibits an increased magnetoresistive effect, such that the sensor material of each of said first and second layers has a composition based on $(A_1)_{1-x}(A2)_x MnO_z$, wherein A1 is a trivalent constituent which is selected from a group of the lanthanides including lanthanum (La), or from yttrium (Y), wherein A2 is a bivalent constituent selected from a group of alkaline-earth metals, or from lead (Pb), and wherein:

$0.1 \leq x \leq 0.9$ and $2.0 \leq z \leq 3.5$;

wherein the sensor material of the second layer of the layer system differs, in terms of proportion and/or element of at least one of its constituents A1, A2, Mn, and O, from the sensor material of the first layer of the layer system, a temperature correlation of the electrical resistance of the sensor materials of said first and second layer being different and compensating at least partly for one another so that the temperature correlation of the electrical resistance of the layer system is reduced with respect to a temperature correlation of the electrical resistance of each individual layer.

2. A magnetoresistive sensor according to claim 1, wherein in at least one of the first and second layers, the Mn of the Mn constituent is partly replaced by at least one additional element A3 from a group of adjacent group elements with a 3d electron configuration, or by copper (Cu), or by aluminum (Al), so that said constituent has the composition:

$$Mn_{1-y}(A3)_y,$$

wherein $0<y \leq 0.35$.

3. A magnetoresistive sensor according to claim 1, wherein the first layer and the second layer have different thicknesses.

4. A magnetoresistive sensor according to claim 2, wherein the layer system includes more than two layers which alternate between layers similar to said first layer and layers similar to said second layer.

5. A magnetoresistive sensor according to claim 2; wherein the layer system is deposited on a substrate made of a material that has a perovskite-like crystal structure.

6. A magnetoresistive sensor according to claim 1, wherein the first layer and the second layer have different thicknesses.

7. A magnetoresistive sensor according to claim 6, wherein the layer system includes more than two layers which alternate between layers similar to said first layer and layers similar to said second layer.

8. A magnetoresistive sensor according to claim 6, wherein the layer system is deposited on a substrate made of a material that has a perovskite-like crystal structure.

9. A magnetoresistive sensor according to claim 1, wherein the layer system includes more than two layers which alternate between layers similar to said first layer and layers similar to said second layer.

10. A magnetoresistive sensor according to claim 9, wherein the layer system is deposited on a substrate made of a material that has a perovskite-like crystal structure.

11. A magnetoresistive sensor according to claim 1, wherein the layer system is deposited on a substrate made of a material that has a perovskite-like crystal structure.

12. A magnetoresistive sensor according to claim 1, wherein $0.25 \leq x \leq 0.75$.

13. A magnetoresistive sensor according to claim 1, wherein $z=3$.

* * * * *